United States Patent
Haba et al.

(10) Patent No.: US 6,758,984 B2
(45) Date of Patent: Jul. 6, 2004

(54) SELECTIVE REMOVAL OF DIELECTRIC MATERIALS AND PLATING PROCESS USING SAME

(75) Inventors: Belgacem Haba, Cupertino, CA (US); Irina Poukhova, Fremont, CA (US); Masud Beroz, Livermore, CA (US)

(73) Assignee: Tessera, Inc., San Jose, CA (US)

( * ) Notice: Subject to any disclaimer, the term of this patent is extended or adjusted under 35 U.S.C. 154(b) by 161 days.

(21) Appl. No.: 09/945,775

(22) Filed: Sep. 4, 2001

(65) Prior Publication Data

US 2002/0011421 A1 Jan. 31, 2002

Related U.S. Application Data

(62) Division of application No. 09/247,156, filed on Feb. 9, 1999, now Pat. No. 6,334,942.

(51) Int. Cl.[7] .................................................. C23F 1/00

(52) U.S. Cl. ....................................................... 216/67

(58) Field of Search ....................... 216/67–71; 438/725

(56) References Cited

U.S. PATENT DOCUMENTS

| | | | |
|---|---|---|---|
| 4,376,672 A | * 3/1983 | Wang et al. | 156/643 |
| 4,787,957 A | * 11/1988 | Barkanic et al. | 156/643 |
| 5,148,265 A | 9/1992 | Khandros et al. | 357/80 |
| 5,148,266 A | 9/1992 | Khandros et al. | 357/80 |
| 5,489,749 A | 2/1996 | DiStefano et al. | 174/261 |
| 5,518,964 A | 5/1996 | DiStefano et al. | 437/209 |
| 5,536,909 A | 7/1996 | DiStefano et al. | 174/261 |
| 5,597,470 A | 1/1997 | Karavakis et al. | 205/118 |
| 5,619,017 A | 4/1997 | DiStefano et al. | 174/260 |
| 5,770,523 A | * 6/1998 | Hung et al. | 438/725 |
| 6,033,582 A | * 3/2000 | Lee et al. | 216/67 X |

* cited by examiner

Primary Examiner—Donald R. Valentine
(74) Attorney, Agent, or Firm—Lerner, David, Littenberg, Krumholz & Mentlik, LLP

(57) ABSTRACT

A metal is provided on a polymeric component and the component is subjected to a removal process such as plasma or liquid etching in the presence of an electric field. The etchant selectively attacks the polymer at the boundary between the metal and the polymer, thereby forming gaps alongside the metal. A cover metal may be plated onto the metal in the gaps. The cover metal protects the principal metal during subsequent etching procedures.

8 Claims, 8 Drawing Sheets

SELECTIVE REMOVAL OF DIELECTRIC MATERIALS AND PLATING PROCESS USING SAME

CROSS-REFERENCE TO RELATED APPLICATIONS

The present application is a Divisional of U.S. patent application Ser. No. 09/247,156, filed Feb. 9, 1999 now U.S. Pat. No. 6,334,942, the disclosure of which is hereby incorporated by reference herein

BACKGROUND OF THE INVENTION

The present invention relates to components for microelectronic devices and to methods of making such components.

Many components used in microelectronic assemblies include fine leads that are used for connection to other elements of the device. For example, as taught in commonly assigned U.S. Pat. Nos. 5,148,265; 5,148,266; 5,489,749; 5,536,909; 5,518,964 and 5,619,017 and PCT Publication WO/94/03036, the disclosures of which are hereby incorporated by reference herein, a microelectronic connection component may include a large number of electrically conductive terminals and leads disposed on a suitable support such as a dielectric sheet or a composite element including both metal and dielectric layers. The leads may include connection sections projecting beyond edges of the support or across apertures in the support. The connection sections may be bonded to contacts on a semiconductor chip to thereby connect the chip contacts to the terminals on the component. Most often, the leads are formed principally from a metal such as copper or a copper-based alloy. As disclosed, for example, in commonly assigned U.S. Pat. No. 5,597,470, it is often desirable to provide a layer of a cover metal over some or all of the surfaces of the principal metal portion of the lead. Depending upon the particular application, the cover metal may provide enhanced properties such as easier bonding of the leads to chip contacts or other structures; enhanced fatigue resistance; or enhanced corrosion resistance.

One common procedure for making leads on a support utilizes a thin conductive layer, typically copper, on a dielectric layer such as a dielectric layer of a rigid circuit panel or a flexible circuit panel, commonly referred to as a "tape". A layer of photoresist is applied over the conductive layer and patterned using conventional photographic processes to provide a series of openings in the form of elongated slots at locations where the leads are to be formed. The slots in the photoresist leave portions of the conductive layer at the bottom of each slot exposed. The principal metal such as copper is then deposited in the slots, typically by electroplating the principal metal onto portions of the conductive layer exposed within each slot. The principal metal deposited within each slot fills the bottom portion of the slot. A layer of the cover metal is deposited onto the top surface of the principal metal deposit, facing away from the support by a further electroplating step. The resist is removed and the part is exposed to an etchant that will attack the conductive layer, thereby removing the conductive layer from regions between the leads. In a variant of this process, a layer of the cover metal is deposited on the conductive layer within each slot before deposition of the principal metal, so as to form a cover metal layer on the bottom surface of each principal metal deposit, facing toward the support. After the etching step used to remove the conductive layer, further cover metal may be deposited onto all of the lead surfaces by a further electroplating step.

Typically, the etchant that is used to remove the conductive layer will not attack the cover layer appreciably but will attack the principal metal. The cover layer on the top surface of the principal metal will protect the principal metal from the etchant to some degree. A cover layer on the bottom surface can also provide some protection. However, the vertically-extending edge surfaces of the principal metal are not covered by the cover metal, and these surfaces are attacked by the etchant. Loss of principal metal results in a lead having an irregular cross-sectional shape and "undercutting" or removal of principal metal from beneath the top cover layer, leaving portions of the top cover layer projecting laterally at edges of the lead. Moreover, the principal metal in the finished lead will have cross-sectional area smaller than the cross-sectional area of the original principal metal deposit. All of these phenomena tend to weaken the lead, and to reduce its electrical performance. Moreover, the projecting portions of the top cover layer can break off of the lead, a phenomenon commonly referred to as "flaking". This can cause short circuits between adjacent leads. These phenomena are subject to some variability depending due to variations in the etching process. These phenomena and variations in these phenomena are more significant in the case of fine leads, with small nominal cross-sectional dimensions.

Thus, there has been a need for a lead-forming process that will alleviate the problem of edge surface undercutting. Other metallic elements are also formed by processes similar to the lead-forming process discussed above. For example, metallic terminals are often formed on supports using a process which is the same as the conventional lead-forming process discussed above, except that the openings in the photoresist layer may be in the form of circular discs, squares, ovals or other desired terminal shapes rather than elongated slots. The openings used to form the terminals may be connected with the elongated slot like openings used to form the leads, so as to form the terminals integral with the leads. Etching of the terminal edge surfaces presents the same problem as discussed above with reference to the leads. Similar problems can occur in formation of still other conductive elements, and hence there has been a similar need for a fabrication procedure that alleviates these problems.

Another procedure which is often used in fabrication of microelectronic components is plasma etching of polymeric materials. For example, a reactive plasma can be used to etch polyimide. A part having a polymeric surface is disposed within a plasma treatment chamber and a plasma is formed at subatmospheric pressure by an electrical discharge between a pair of electrodes disposed within the chamber, or between an electrode and a conductive wall of the chamber. Chemically reactive species formed within the plasma attack the polymeric material. This process can be employed to form holes in a polymeric layer. As disclosed in copending, commonly assigned U.S. patent application Ser. No. 09/020,750, filed Feb. 9, 1998, the disclosure of which is hereby incorporated by reference herein, such a process can also be used to remove polymeric material from beneath a lead on a polymeric support, so as to make the lead detachable from the support. It would be desirable to increase the speed and efficiency of such a process. Moreover, it would be desirable to provide such a process with selectivity, so that the process attacks the polymeric layer preferentially in regions adjacent to metallic features on the polymeric layer.

Yet another procedure used in manufacture of microelectronic components is electrochemical stripping. Polymeric materials such as acrylic polymers found in certain photoresists can be removed from the surface of an underlying structure by exposing the surface to a bath of a liquid stripper that attacks the polymer. It would be desirable to provide for selective removal of the photoresist adjacent to metallic features.

SUMMARY OF THE INVENTION

One aspect of the invention provides a method of etching a polymeric article having metallic features at a surface of the polymeric article comprising the steps of exposing the surface having the metallic features to a plasma reactive with the polymer constituting the surface. Preferably, the plasma is maintained by applying electrical energy such as an alternating electric field, typically at radio frequencies ("RF") or other frequencies. The plasma selectively etches the polymer adjacent the metallic features. In a method according to the this aspect of the invention, the plasma may be an oxidizing plasma such as a plasma containing one or more constituents selected from the group consisting of oxygen and halogens, most preferably a plasma containing oxygen and fluorine. The polymer desirably is an organic polymer, and may be a photoresist.

The method may include the step of applying an electrical potential to the metallic features of the article being treated. The potential applied to the metallic features desirably is an alternating potential, such as an RF potential or lower frequency potential. The potential applied to the metallic features may provide some or all of the energy input needed to sustain the plasma. Application of the potential to the metallic features enhances the selectivity of the etching process.

A further aspect of the invention provides a method of electrochemically stripping a polymeric material from a surface of an article having metallic features as well as polymer at such surface. The method according to this aspect of the invention desirably includes the steps of contacting the surface of the article with a liquid etchant reactive with the polymeric material in the article and applying an electrical potential to metallic features of the article at the surface during the contacting step so that the liquid etchant preferentially attacks the polymer adjacent said metallic features. The etchant may be an ionic or partially ionic liquid, such as an alkaline liquid of the type commonly employed in stripping photoresists. For example, the etchant may include organic tertiary amines such as triethanolamine. The polymer may include polar moieties, and may be an acrylic polymer such as a resist of the type commonly used in electrophoretic deposition processes.

Although the present invention is not limited by any theory of operation, it is believed that the selectivity of the polymer removal in processes according to both of the foregoing aspects of the invention arises at least in part from concentration of electrical charge or electric fields at the juncture of the metal and polymer on the surface. Apparently, the discontinuity between the relatively high electrical conductivity of the metal and the far lower electrical conductivity of the polymer causes concentration of charge or fields at the juncture between the metal and the polymer. Regardless of the theory of operation, however, it has been found that the processes discussed above promote selective etching of the polymer adjacent the metal. In particular, where the metal feature at the surface has an edge surface extending downwardly into the polymer, the polymer is selectively removed in an etch region extending downwardly into the polymer alongside the edge surface of the metal, so as to form gaps alongside the edge surfaces.

A further aspect of the invention provides methods of making metallic features, such as leads or other metallic features of a microelectronic connection component, on a support. A method according to this aspect of the invention desirably includes the steps of providing a resist on a surface of the support so as to leave openings in said resist at locations where metallic features are to be formed, and depositing a principal metal on said support in the openings to form a principal metal deposit with a top surface remote from the support and edge surfaces extending downwardly from the top surface toward the support. The method further includes the step of treating the resist so as to remove resist adjacent the principal metal. For example, the surface of the article having the resist and principal metal may be subjected to selective removal treatments as discussed above.

Selective removal of the resist forms gaps between the edge surfaces and the resist and thereby exposes the edge surfaces of the principal metal deposit but leaves at least some of the resist on regions of the support remote from the principal metal deposit. Following selective removal of the resist, a cover metal is deposited onto the exposed edge surfaces of the principal metal deposit. Preferably, the step of depositing the cover metal is performed so as to deposit cover metal on the top surface of the principal metal, facing away from the support as well as on the edge surfaces. Also, cover metal may be provided on the bottom surface of the principal metal by applying cover metal on the support prior to applying the principal metal. Desirably, the cover metal on the top, bottom and edge surfaces of the support is continuous and completely surrounds the principal metal. The method desirably further includes the steps of removing the resist after the step of depositing the cover metal, typically by a nonselective process such as application of a conventional resist stripper or exposure to a plasma effective to strip the resist.

The support may include a conductive layer and the step of depositing the principal metal is performed so as to deposit the principal metal over the conductive layer. In this case the method may include the step of etching the conductive layer to completely or partially release the principal metal deposit from the surface after the step of removing the resist. The cover metal protects the edge surfaces during the step of etching the cover layer. Thus, the formed metallic feature has the intended shape, without the severe undercutting that has occurred in certain processes employed heretofore.

DETAILED DESCRIPTION OF THE PREFERRED EMBODIMENT

Figure 1:
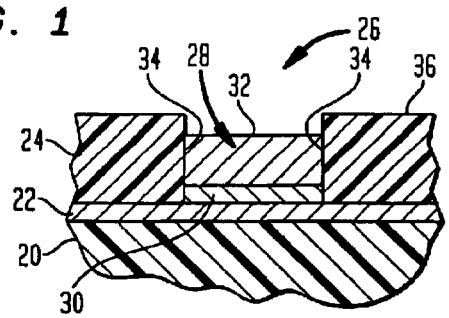
FIGS. 1 through 5 are diagrammatic, fragmentary sectional views depicting a component during successive stages of manufacture in a process according to one embodiment of the invention.

A process according to one embodiment of the invention begins with a base or substrate 20 formed at least in part from a conventional dielectric material such as a polyimide, epoxy or other polymer. Substrate 20 has an electrically conductive layer 22 formed from a readily etchable metal such as copper or copper-based alloy on a surface. The substrate may include other conventional features such as internal conductors, conductive potential reference planes and the like (not shown). A layer of a polymeric material such as a photoresist 24 is deposited and subjected to a patternwise treatment such as a photographic exposure and then cured in the conventional manner so as to leave openings 26 at locations where conductive features are to be formed.

For example, the photoresist 24 may be an electrophoretic photoresist such as those sold under the trademark Eagle 2100 ED Photoresist by the Shipley Company of Marlborough, Mass. This photoresist can be deposited electrophoretically onto conductive layer 22 by a conventional electrophoretic deposition process in which the component is immersed in a bath of an aqueous dispersion containing the resist. Conductive layer 22 is maintained at positive electrical potential with respect to a counterelectrode (not shown) also immersed in the bath. Following deposition, the layer of photoresist is selectively patterned using a conventional photographic exposure process so that only selected areas of the deposited resist are cured. Following photographic exposure and partial curing in this manner, the uncured resist is washed away, leaving openings 26 in the layer of resist 24. After stripping of uncured resist, the resist may be further cured by baking at an elevated temperature, typically about 40–100° C. for a few minutes.

After the openings have been formed, a principal metal 28 is deposited within the openings by electroplating. Preferably, a bottom cover layer 30 formed from a relatively etch-resistant cover material such as a metal selected from the group consisting of gold, osmium, rhodium, platinum, tin, nickel, chromium and alloys thereof is deposited within each opening before the principal metal 28 is deposited. These metals are deposited within the openings by immersing the component with the resist layer thereon into a conventional electroplating bath and applying plating current through the conductive layer 22. The dimensions of openings 26 define the dimensions of the deposited metal features in horizontal directions parallel to the surface of conductive layer 22, whereas the amounts of metal deposited in the electroplating processes define the thicknesses of such features. These dimensions are selected by the function to be performed by the metallic features in the finished component. For typical applications where the metallic features are to function as flexible leads, the metallic features typically are about 15–60 microns wide and have a total thickness of about 10–40 microns.

As deposited the principal metal layer 28 has a top surface 32 facing away from bottom cover layer 30 and conductive layer 22 and a pair of edge surfaces 34 extending downwardly from the top surface 32. The edge surfaces 34 closely conform to the surfaces of resist layer 24 defining the opening 26. Stated another way, the component at this stage has a polymeric surface layer or resist 24 defining an exposed top surface 36 and has a metallic feature including principal metal layer 28 exposed at the top surface 36 and extending downwardly into the article from the top surface.

In the next stage of the process, the article is immersed in a bath 38 of a liquid etchant reactive with the polymer of layer 24 defining surface 36. Where layer 24 is formed from a photoresist as discussed above, the solution may be a solution of the type normally used to remove the photoresist. For example, a solution of the type sold under the designation EPR Stripper 3460 by the Cherokee Chemical Company of Hawthorne, Calif. may be employed with a layer formed from the aforementioned Eagle 2100 photoresist. The EPR stripper includes components such as n-methy2-pyrrolidone, monoethanolamine and ethylene glycol monobutyl ether. The stripper as supplied desirably is diluted with water typically about one part water to about four parts stripper. The bath desirably is maintained at about 70° C. (160° F.). In general, the concentration and temperature used with a given etchant should be slightly less than those used to provide rapid, nonselective attack by the etchant on the polymer. A counterelectrode 40 is immersed in the etchant bath along with the component. Conductive layer 22 is maintained at a negative electrical potential with respect to counterelectrode 40 by a DC power source 42. Desirably, conductive layer 22 is maintained at about 50 volts to about 200 volts with respect to counterelectrode 40.

Figure 2:
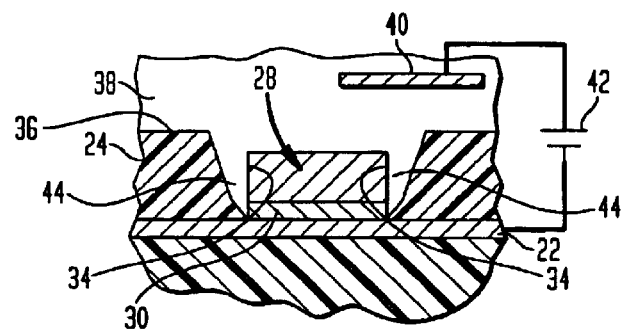

Under these conditions, the etchant attacks the polymer of layer 24 selectively adjacent to edge surfaces 34 of the principal metal layer 28. Although the present invention is not limited by any theory of operation, it is believed that this selective attack is caused at least in part by concentration of electric fields at the juncture between the highly conductive metallic structure and the dielectric polymer, and concentration of electrical charge at these locations. Regardless of the theory of operation, continued exposure of the component to the etchant with the electrical potential applied as discussed above forms gaps 44 between the edge surfaces 34 of the principal metal 28 and the resist 24. The width of these gaps is exaggerated in FIG. 2 for clarity of illustration. In actual practice, the gaps form as relatively narrow slots adjacent the edges of the principal metal. As illustrated in FIG. 2, the gaps may extend downwardly beyond the principal metal to the edges of the bottom cover material layer 30. The process desirably is terminated at about the time the gaps reach the conductive layer 22. That is, the gaps 44 should extend at least to the bottom of the principal metal layer 28. Where a bottom cover layer 30 is provided, gaps 44 should extend slightly beyond the bottom of the principal metal layer. The time required for gap formation will vary with the etchant composition; the polymer composition; and temperature and the voltage applied, as well as on the thickness of the polymer layer and the required depth of gaps 44. Typically, a few seconds to about a minute is sufficient. The appropriate time can be established for any given system by trials using various times. Once the process conditions have been selected, the results typically are repeatable, so that the same conditions can be used repeatedly in production operations.

After the resist has been selectively removed and the gaps have been formed, the component is rinsed to remove the etchant and immersed in a further electroplating bath and an additional layer of an etch-resistant cover material 46, such as a metal selected the group of cover metals discussed above, is deposited on the edge surfaces 34 and top surface 32 of the principal metal deposit 28. The additional cover metal 46 may be the same as, or different from the cover metal of bottom cover metal layer 30. The additional cover metal 46 extends downwardly along the edge surfaces from top surface 32 and desirably extends all the way to the bottom cover metal layer 30 so that the additional cover metal 36 and the metal in the bottom cover layer 30 form a continuous jacket of cover metal enclosing the principal metal 28. Here again, although the present invention is not limited by any theory of operation, it is believed that plating of the additional cover metal on the edge surfaces of the principal metal is promoted by concentration of electrical charge and/or electric fields in gaps 44, at the junctures between the metallic structures and the dielectric material in layer 24. Regardless of the theory of operation, some of the cover material 46 is deposited on the lower portions of edge surfaces 34 despite the fact that these portions of the edge surfaces are located deep within the relatively narrow gaps 44. It is not essential that the additional cover material 46 have a uniform thickness. However, the additional cover material desirably forms a continuous layer over the entirety of the edge surfaces. The plating process may be continued beyond the point where a continuous layer is formed, so that the additional cover material entirely fills gaps 44 and forms a relatively thick layer on the top surface 32 of the principal metal. Typically, the additional cover material is plated to about 0.2 to about 5 microns thick on the top surface 32 of the principal metal.

After the additional cover metal has been applied, the polymeric material or resist 24 is entirely removed by any conventional process such as by prolonged exposure to a liquid etchant or resist stripper as discussed above, or by exposure to a reactive plasma. The conditions used for stripping the photoresist layer in this stage may be more severe than the exposure conditions used for the selective etching procedure discussed above with reference to FIG. 2. Thus, the stripper may be provided at a higher concentration and/or at a higher temperature, and the process may be continued for a longer time. During this stage of the process, it is not essential to apply an electrical potential to the conductive layer.

Figure 4:
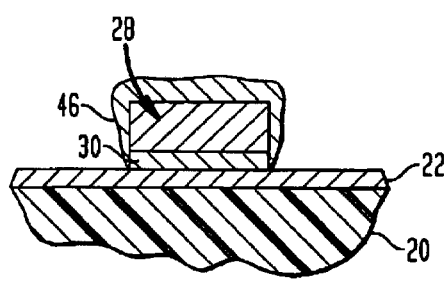
Figure 5:
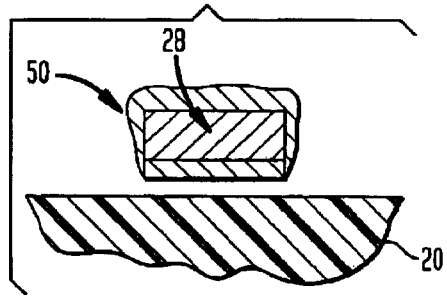

Once the resist has been entirely removed, the metallic features are present on the conductive layer 22 of the component. As seen in FIG. 4, each of the principal metal features 28 has a continuous jacket of cover material including the additional cover material 46 and the bottom cover layer 30. The conductive layer 22 can then be removed from the polymeric body 20 by exposure to an etchant which is effective to attack the conductive layer but which does not substantially attack the protective cover metal. For example, where conductive layer 22 is formed from copper, a conventional HCl/CuCl$_2$ etchant may be employed to remove the conductive layer. Removal of the conductive layer detaches the metallic element from the dielectric body 20 as shown in FIG. 5. Thus, as shown in FIG. 5, the process yields a lead 50 overlying body 20.

As described in the aforementioned commonly assigned patents, such a lead typically is not detached from the dielectric body 20 over its entire length. Rather, the lead is formed in conjunction with other features, such as metallic vias extending into the polymeric body, which anchor the lead at one or both ends. Alternatively or additionally, portions of the conductive layer 22 may be left in place, as by masking these portions of the conductive layer during the step of removing the conductive layer, so as to leave ends of the leads anchored to the dielectric layer in the areas where the conductive layer is not removed.

Figure 6:
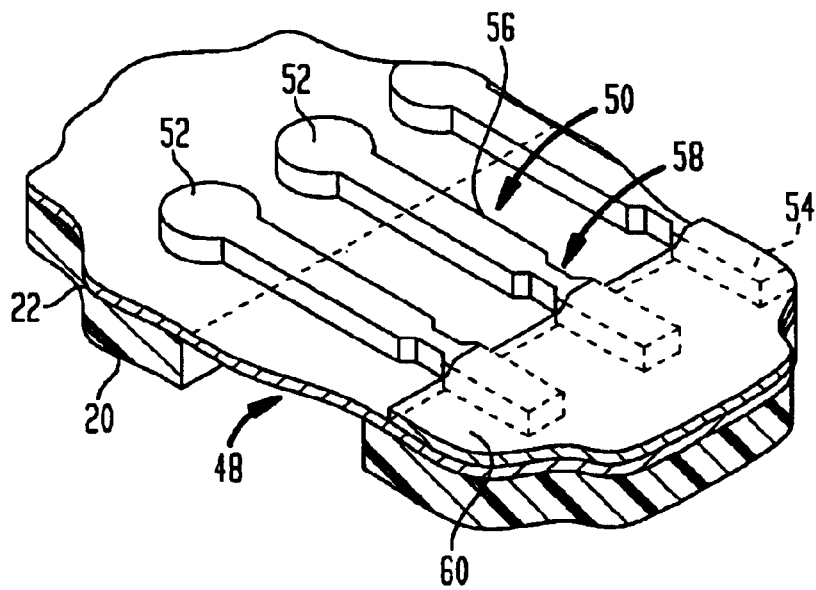
FIGS. 6 and 7 are fragmentary, diagrammatic perspective views depicting the component of FIGS. 1–5.
Figure 7:
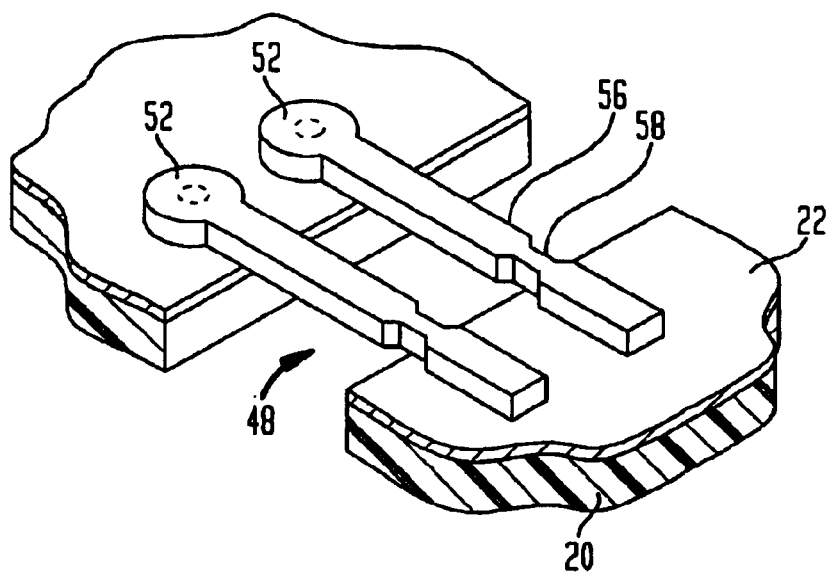

Merely by way of illustration, the metallic features formed by the process as discussed above may include elongated leads 50 having relatively wide terminals 52 (FIG. 6) at a first end, having an anchor section 54 at a second, opposite end and having connection sections 56 narrower than the terminals extending from the terminals. The connection sections are joined to the anchor sections by relatively narrow frangible regions 58. All of these features of the metallic lead are formed by the process as discussed above with reference to FIGS. 1–4, so that the metallic features overlie the metallic conductive layer 22 of the component. The leads are provided in an array so that the connection sections 56 extend side by side. An aperture 48 is provided in the polymeric body 20 in the form of an elongated slot extending beneath the connection sections 56 and frangible sections 58 of the leads, as by laser ablating or etching polymeric body 20. A masking layer 60 is provided over anchor sections 54 of the leads and the adjacent areas of conductive layer 22. After application of the masking layer and either before or after formation of slot 48, the component is immersed in the etching solution used to remove the conductive layer 22. The conductive layer is etched entirely away in the areas overlying slot 48, and in the regions between terminals 52 and the adjacent sections of the leads, but the conductive layer remains in place at the anchor sections. This leaves the leads in the condition illustrated in FIG. 7, with connection sections 56 extending across gap 48 and with anchor regions 54 remaining attached to the polymeric layer 20 of the remaining portion of conductive layer 22. During the etching process, portions of the conductive layer lying beneath the relatively wide terminals 52 are protected from the etchant by the terminals and hence remain beneath the terminals, thus keep the terminals anchored to the polymeric body 20. In other cases, the terminals may be formed integrally with metallic vias extending into or through the polymeric body. As described, for example, in the aforementioned U.S. Pat. Nos. 5,489,749 and 5,536,909, as well as in U.S. Pat. No. 5,619,017 and PCT Publication WO 94/03036, the individual connection sections can be broken away from the associated anchor regions by a bonding tool and bonded to contacts on a semiconductor chip. In the as-bonded condition, the individual leads are electrically isolated from one another.

In other cases, the slotlike aperture discussed above may be replaced by individual apertures associated with individual leads. In still other cases, the anchor sections are omitted. Alternatively, as described in U.S. Pat. No. 5,518,964, the leads may have terminal ends permanently secured to the dielectric component, as by vias extending into the dielectric component and may have tip ends detachably secured to the dielectric component so that the tip ends may be bonded to contacts on a chip or other structure and the tip ends of all of the leads may be pulled away from the dielectric structure by moving the dielectric structure with respect to the chip or other component. In a further variant, portions of the conductive layer 22 used to form the leads may be left in place on the surface of substrate 20, such as in the regions between the leads, so that these remaining portions of the conductive layer act as a potential plane, such as a ground plane or power plane. These residual portions of the dielectric layer may be left in place by selectively masking the conductive layer prior to the etching step used to remove the conductive layer. Thus, masking layer 60 (FIG. 6) may include additional portions disposed between the terminal ends of the leads, and in other areas where the potential plane is to remain. However, the masking layer in these regions does not extend all the way to the leads or terminals. Therefore, the conductive layer will be etched away in gaps surrounding the terminal ends of the leads, leaving the resulting potential plane layer electrically isolated from the terminal ends of the leads.

Figure 8:
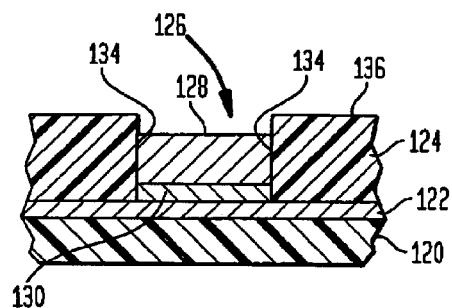
FIGS. 8 through 10 are views similar to FIG. 1 but depicting a component during successive stages of manufacture in a process according to another embodiment of the invention.

A process according to a further embodiment of the invention uses a component incorporating a dielectric layer 120 and a conductive layer 122 (FIG. 8). A resist or polymeric material 124 with openings 126 is provided in substantially the same way as discussed above. Here again, a bottom cover metal layer 130 and a principal metal 128 are deposited in openings 126 so as to form metallic structures. At this stage of the process, the component includes a surface 136 defined by the polymeric material or resist 124 and a metallic structure exposed at such surface and having edges 134 extending downwardly from the exposed surface towards the conductive layer.

After the plating process, the resist may be subjected to a further baking process, typically between about 40–100° C. and more typically at about 50–80° C. for about 5–10 minutes to further cure the resist. Following such further curing, the resist desirably is exposed to ultraviolet light at an intensity of about 10–200 mW/cm² for about 5 sec-30 minutes. The applied ultraviolet light renders the resist more susceptible to attack by the plasma, but does not completely degrade the resist to the point where the resist layer loses physical coherence.

Figure 9:
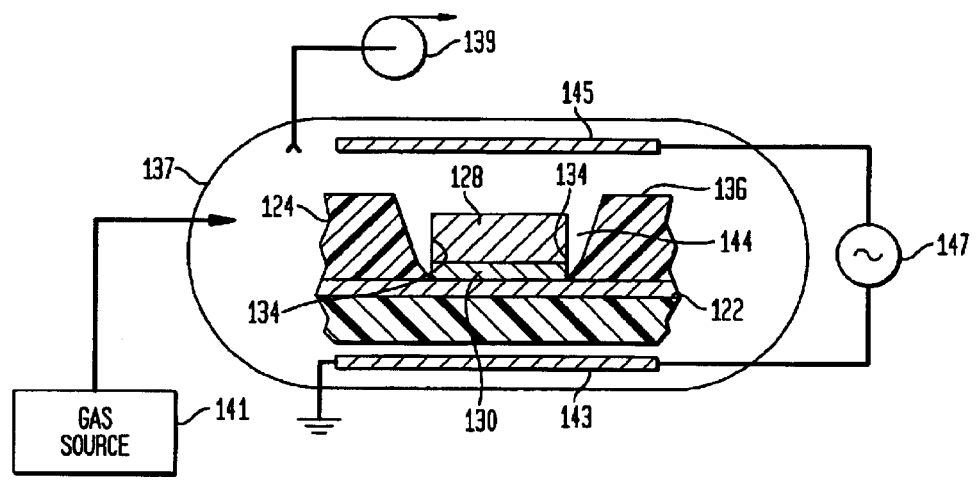
Figure 10:
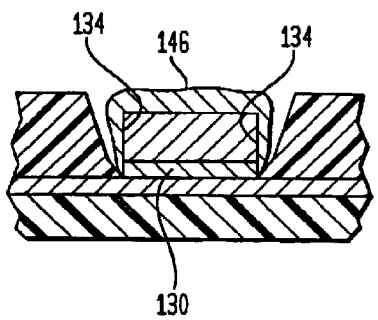

After the metallic structures have been formed, the component is subjected to a plasma etching process in a chamber 137 (FIG. 9). The chamber is provided with a conventional vacuum pump 139 and associated conventional control system for maintaining a subatmospheric pressure. A gas source 141 is provided for supplying a gas mixture. The plasma-forming gas supplied by source 141 desirably includes a halogen containing gas such as $SF_6$ or, preferably a lower halogenated hydrocarbon as, for example, tetrafluoromethane, and may also include oxygen. Optionally, an inert gas such as argon may be added. For example, the plasma-forming gas typically includes about 10–20% $CF_4$ and about 70–80% $O_2$. The vacuum pump 139 and gas supply source desirably are arranged to move the etching gasses through the chamber at a rate sufficient to remove etched materials, and thereby limit redeposit of etched materials onto the work.

The plasma chamber is also provided with a pair of electrodes 143 and 145. One electrode is grounded, whereas the other electrode is isolated from ground. An alternating potential source 147 is connected between the electrodes. Typically, the chamber wall itself serves as a part or all of the ground electrode. In the particular arrangement illustrated in FIG. 9, the grounded electrode 143 includes a shelf supporting the component. Potential source 147 is arranged to apply an alternating potential at a radio frequency formed desirably between about 40 KHz and about 100 MHz. A so-called "ISM" frequency allocated by radio communications authorities for industrial process equipment, such as 13.58 MHz, is commonly employed. The interior of the chamber desirably is maintained at a submospheric pressure, typically a few milliTorr to one Torr. The applied electrical potential converts the gas to a plasma that includes highly reactive species such as monoatomic F and O, and ions of such species. The plasma etches the polymeric material in layer 144. Here again, the etching process is concentrated in regions adjacent the junctures of the dielectric layer 124 with the conductive, metallic structure 128. Thus, the polymeric material is etched at a greater rate adjacent the edge surfaces 134 of the principal metal 128, so that gaps 144 are formed adjacent the edged surfaces. Some polymeric material is also removed from regions of the layer 124 remote from the metallic features, but the rate of such removal is markedly less than the rate of removal at the edge surfaces. Thus, gaps form adjacent the edge surfaces of the principal metal 128 and extend downwardly from the exposed surface 136 of the polymer layer. Desirably, the process is continued until the gaps extend downwardly at least to the bottom cover metal layer 130. However, the exposure is terminated before the resist layer 124 is completely removed in regions remote from the metallic structure 128.

The exposure time required to form gaps extending into the polymer layer by the required distance depends upon the etching gases employed; upon the composition of the polymeric layer; and plasma conditions such as applied power, frequency pressure, flow rate, electrode structure and time. Here again, the process is repeatable, so that once the process conditions are established by trial and error, the same can be used repeatedly. Typically, about 5–20 minutes plasma etching, at an applied power of about 1,000 watts (0.05–1 watts/cm² of exposed polymer surface) is sufficient to produce gaps of the required depth.

After this selective plasma etching process, additional cover metal 134 is applied on the principal metal deposit 128 and covers the top surface 132 as well as the edge surfaces 134 of the principal metal. Here again, the additional cover metal desirably merges with the bottom cover metal layer 130 to form a continuous jacket enclosing the principal metal 128. Once again, the remaining portions of the polymeric or photoresist layer 124 mask those portions of the conductive layer 122 remote from the deposited metal structure, so that the additional cover metal is not deposited on these portions of the conductive layer. After the additional cover material 146 is applied, the component may be further processed as discussed above.

Figure 3:
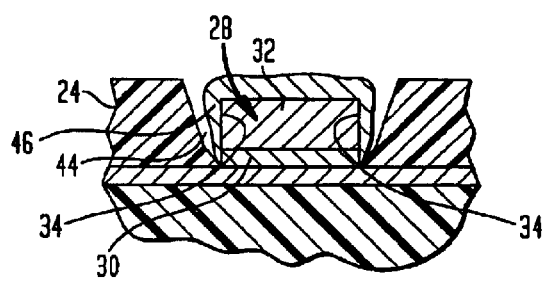
Figure 11:
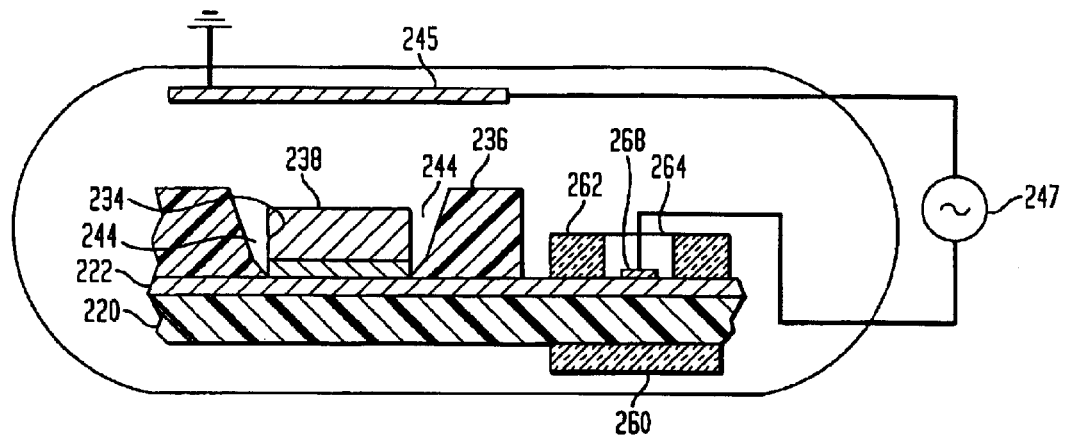
FIG. 11 is a diagrammatic, partially fragmentary view depicting a component during a stage of manufacture in a process according to yet another embodiment of the invention.

In a process according to a further embodiment of the invention, the conductive layer 222 of the component (FIG. 11) is conductively coupled to one side of the alternating potential source 247, so that the conductive layer of the structure itself serves as one of the electrodes in the plasma excitation process. The opposite electrode 245 may be connected to ground. For example, where the polymeric body of the article 220 is in the form of a thin sheet, the sheet may be held in a rigid dielectric frame. As schematically shown in FIG. 3, the frame may include a pair of ring-like elements 260 and 262. The dielectric sheet 220 with the conductive layer 222 thereon is grasped between elements 260 and 262. The dielectric frame holds the polymeric sheet taut and maintains the sheet under tension. Frame element 262 has a hole 264 extending through it. An electrode 268 connected to potential source 247 is engaged with the conductive sheet 222 within hole 264. The use of a frame for processing flexible sheet-like elements is described in greater detail in copending, commonly assigned U.S. Provisional Patent Application No. 60/061,932 filed Oct. 17, 1997 and entitled Framed Sheet Processing, the disclosure of which is hereby incorporated by reference herein.

Application of the alternating potential through the conductive layer 222 serves to apply the potential to the metallic features extending to the polymeric surface, such as the principal metal deposits 238 extending to the polymeric surface 236. This in turn greatly accentuates the rate of etching at the junctures of the conductive feature and the surrounding polymer as, for example, the rate of etching in gaps 244 bordering the edge surfaces 234 of the metallic deposit 238. Desirably, the frequency of the alternating potential applied by potential source 247 is selected so as to provide a good impedance match between the potential source and the metallic features of the structure. Additional inductance and/capacitance may be provided in conjunction with the metallic layer and other metallic features as, for example, by forming inductive or capacitive elements integrally with these components, or by connecting additional conductive or capacitive components to the sheet and/or to other features. Additional electrical energy may be supplied through additional electrodes in the plasma chamber, or through an RF coil adjacent the plasma chamber, connected to the same alternating potential source or to another source operating at the same frequency or a different frequency. In a further variant, electrical energy applied to the metallic structures may cause heating of the principal metal deposit, as by inductive or resistive effects. Such heating selectively accelerates etching of the polymer layer immediately adjacent the metallic structures.

Figure 12:
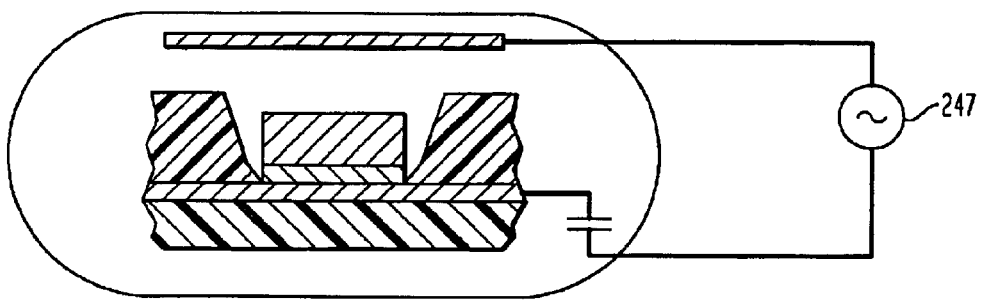
FIG. 12 is a view similar to FIG. 11 but depicting a process in accordance with yet another embodiment of the invention.
Figure 13:
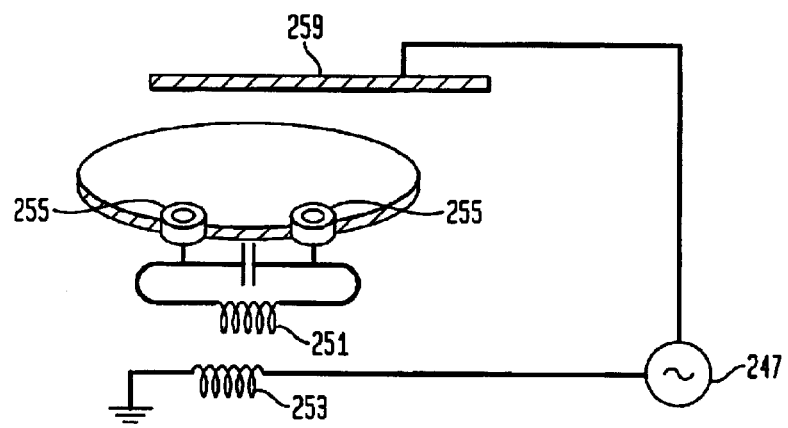
FIG. 13 is a fragmentary, diagrammatic view depicting a stage during a process according to a further embodiment of the invention.

As shown in FIG. 12, the alternating potential source may be capacitively coupled to the metallic features of the part being etched rather than conductively coupled. Also, as shown in FIG. 13, the alternating potential source 247 may be inductively coupled to metallic features of a part being etched. In the arrangement depicted in FIG. 13, the part being processed does not incorporate a continuous conductive layer but instead incorporates individual metallic features conductively connected to one another. Also, the particular metallic features are not elongated strips but are instead cylindrical via liners extending through a dielectric layer formed from a polyimide or other structural dielectric material rather than a dielectric resist. In this case, the selective etching process forms gaps in the resist around the via liners. An inductive element 251 and a capacitive element 253 are connected in circuit with these elements so as to form an L-C resonant circuit. That circuit is inductively coupled to alternating potential source 247 through an inductive element 253 connected between the source and ground. The inductive coupling excites the resonant circuit and thus supplies varying potentials at each of the features 255. The potentials supplied at the various features are not uniform in any given instant. The alternating potential source may also apply alternating potentials to a counterelectrode 259 that is juxtaposed in the plasma chamber (not shown) with the component. Here again, the inductive and capacitive features may be formed as parts of the object being treated, or else may be separate components electrically connected to these features. Here again, the application of electrical potential to the metallic features accelerates the etching at the interfaces between the metallic, conductive features and the surrounding dielectric material.

Figure 14:
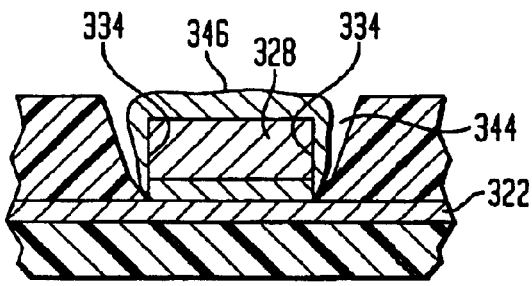
FIGS. 14 and 15 are views similar to FIGS. 1–6 but depicting a process according to a further embodiment of the invention.
Figure 15:
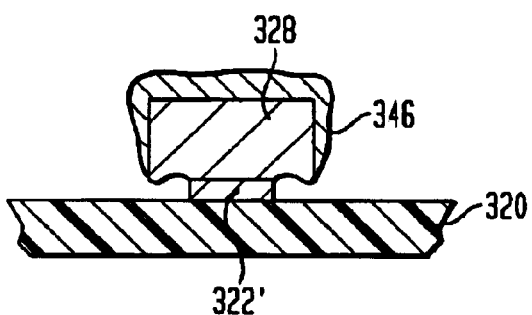

In a process according to a further embodiment of the invention, FIG. 14, where the bottom cover layer is omitted, the principal metal 328 is deposited directly onto the conductive layer 322, and the cover material 346 plated onto the principal metal extends downwardly along the edge surfaces 334 to the gaps 344 formed during selective removal of the polymeric material. The subsequent etching process used to remove the conductive layer may be conducted so as to completely remove the conductive layer 322. Alternatively, as shown in FIG. 15, the etching process may proceed only to the extent needed to remove the conductive layer in areas remote from the deposited metallic structures. The etching leaves a small portion 322' of the conductive layer disposed beneath the deposited principal metal lead or other structure. Here again, etch resistant cover metal 346 on the edge surfaces substantially protects the principal metal from etching during this process. However, some of the principal metal is removed as those portions of the conductive layer 322 underlying the principal metal are etched away, thereby exposing the bottom surface of the principal metal to the etchant. A similar procedure, removing only a portion of the conductive layer from beneath the deposited metal feature can be employed when the deposited metal feature includes a bottom cover layer. Such a procedure can be used, for example, to form a feature that is attached to the underlying dielectric material 320 over only a relatively small area and hence is only weakly attached to the dielectric material. Features of this type are described in greater detail in certain embodiments of copending, commonly assigned U.S. patent application Ser. Nos. 09/195,371, filed Nov. 18, 1998 now abandoned and 09/020,750, filed Feb. 9, 1998, now abandoned the disclosures of which are hereby incorporated by reference herein. Other releasable lead structures using features attached over a relatively small area are disclosed in U.S. Pat. No. 5,518,964, the disclosure of which is also incorporated by reference herein.

Figure 16:
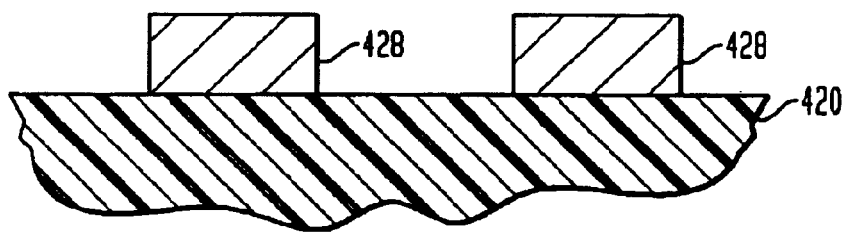
FIGS. 16 and 17 are views similar to FIGS. 14 and 15 but depicting a process according to a yet another embodiment of the invention.
Figure 17:
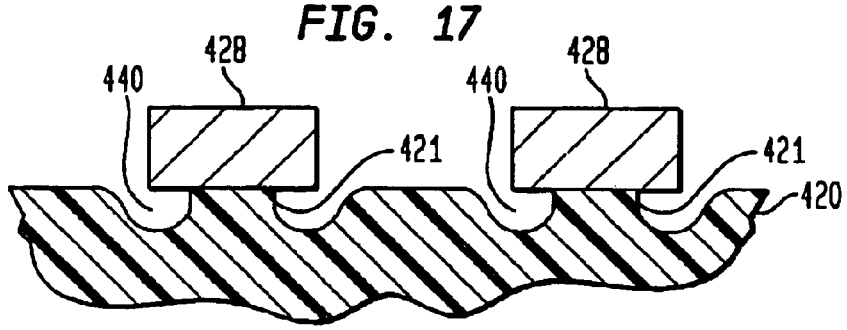

A method according to a further embodiment of the invention uses a substrate having a polymeric layer 420 at a surface and metallic elements, such as elongated leads 428 seen in cross-section in FIG. 16, disposed on such surface. The selective removal of the polymer adjacent to the metal by a plasma or liquid etchant as described above forms gaps beneath the leads. The process is terminated before the etching procedure completely detaches the leads from the polymeric layer. Thus, the process leaves each lead connected to the polymeric layer by a thin connecting element 421 integral with the polymeric layer. As disclosed in the aforementioned copending, commonly assigned U.S. patent application Ser. No. 09/020,750, such a thin polymeric connecting element can be used to provide a detachable lead structure. Thus, the leads can be bonded to a mating element such as a semiconductor chip while the leads are held in place on the substrate by connecting elements 421. After bonding, the substrate and the mating element can be moved away from one another, thus peeling the leads away from the substrate and leaving the leads free to flex.

Numerous variations and combinations of the features discussed above can be utilized without departing from the present invention as defined by the claims. As these and other variations and combinations of the features discussed above can be utilized without departing from the present invention as defined by the claims, the foregoing description of the preferred embodiments should be taken by way of illustration rather than by way of limitation of the invention as defined in the claims.

The following non-limiting examples further illustrate certain features of the invention.

EXAMPLE 1

A polyimide sheet with a 5–10 micron thick copper conductive layer thereon is coated with Eagle 2100 ED photoresist, and solvent is removed by baking. The coating is photographically exposed using 240–400 millijoules applied energy in a pattern including unexposed areas about 10–100 microns wide. The resist is partially cured and then the uncured resist in the unexposed areas is rinsed away leaving openings approximately 10–100 microns wide. Copper is plated to a thickness of approximately 16 microns within these openings. After plating, the component is baked at 50° C. for 10 minutes and then exposed to ultraviolet light at a wavelength of about 360–500 and at an intensity of approximately 3 mW/cm$^2$ for 5 minutes. The component is then exposed to plasma etching as discussed above with reference to FIG. 9 using a plasma forming gas containing approximately 30% $CF_4$; 70% $O_2$ at a pressure of 250 milliTorr using 1,000 Watts applied power for 10 minutes. The total exposed area of the polymeric surface being etched was approximately 400 cm$^2$.

Figure 18:
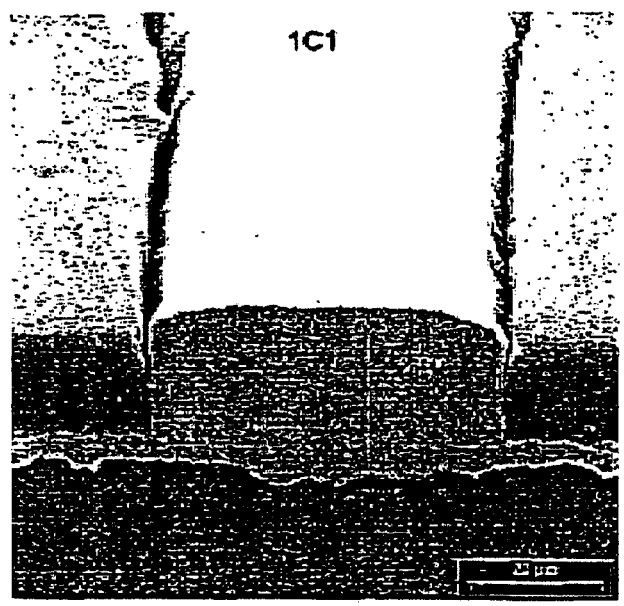
FIGS. 18 and 19 are scanning electron microscope photographs depicting a component in accordance with an example of the invention during two successive stages of its manufacture.
Figure 19:
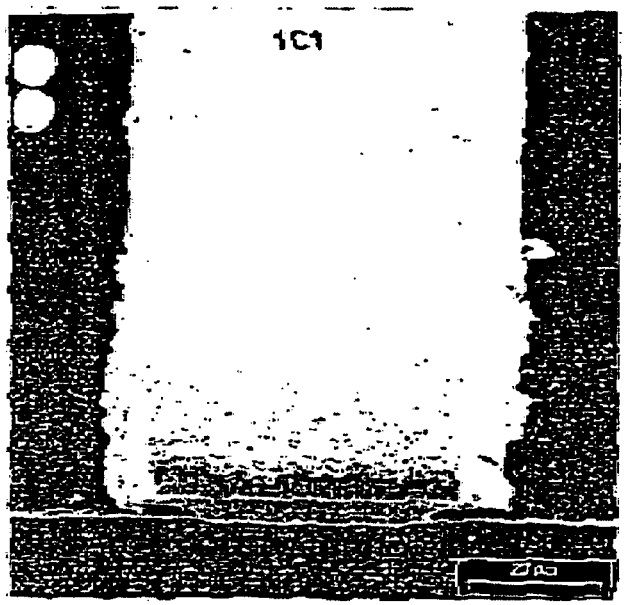

The configuration of the component following plasma etching is shown in FIG. 18. The gaps extending downwardly along side of the metal deposits are indicated by arrows in the photographs. The component is then plated with gold to a thickness of about 1–2 microns on the top surfaces of the deposited copper. During this procedure, gold is also plated on the edge surfaces of the deposited copper in the gaps. After gold plating, the resist is removed and the copper conductive layer is etched away by exposure to an HCl/CuCl$_2$ etchant for about 30–60 sec. In the resulting structure, the copper conductive layer is entirely removed in regions outside of those covered by the leads. The copper conductive layer is also partially removed beneath the lead, as shown in FIG. 19.

EXAMPLE 2

Figure 20:
FIGS. 20 and 21 are scanning electron microscope photographs depicting a component during a process according to a further example of the invention.
Figure 20:
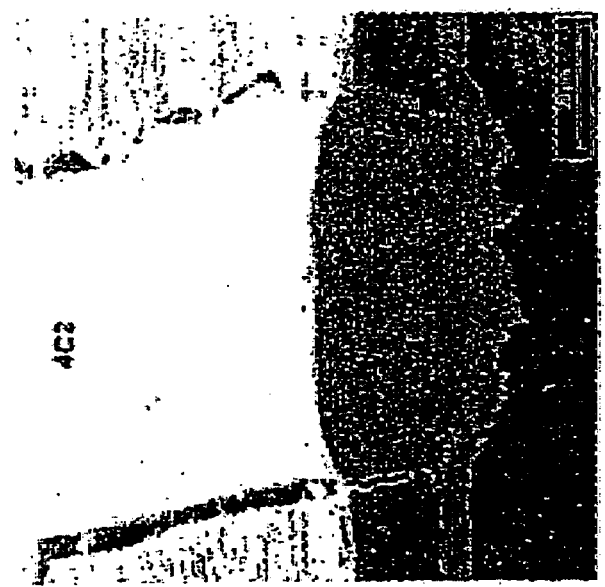
Figure 21:
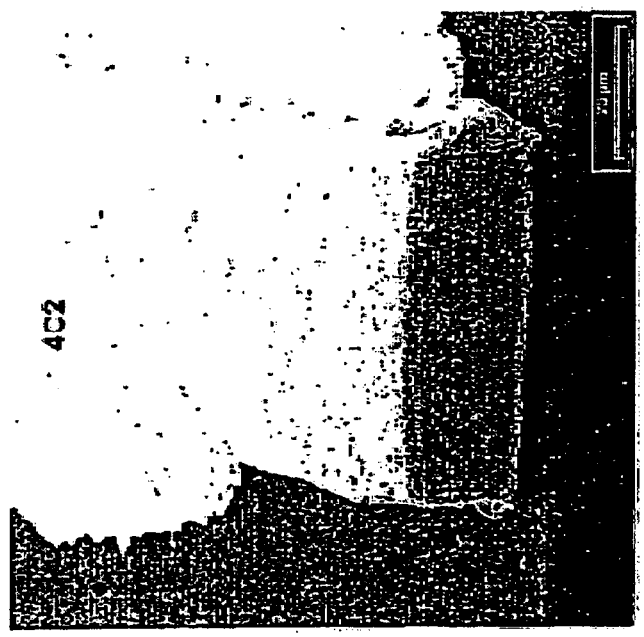

A component is processed as in Example 1 except that a bottom cover layer of 2 micron thick gold is plated into the opening before the copper is plated into the openings. Also, the resist is baked at 80° C. for 5 minutes and exposed to ultraviolet radiation at slightly more than 100 mW/cm$^2$ for 10–15 seconds. The configuration after plating and plasma etching is as shown in FIG. 20. Here again, the gaps formed along side the edge surfaces of the lead are indicated by arrows in the photographs. Additional gold cover material is plated onto the structure after formation of the gaps, to a thickness of about 0.5–2 microns on the top surface of the copper. The additional cover material joins with the bottom cover layer of gold and completely encases the copper or principal metal of the lead. The resist is then removed and the conductive layer is completely etched away by prolonged exposure to HCL/CuCl$_2$ solution. As shown in FIG. 21, the resulting lead is undamaged by the etching procedure used to remove the conductive layer. The copper principal metal is fully protected by the surrounding gold.

COMPARATIVE EXAMPLE

Figure 22:
FIGS. 22 and 23 are scanning electron microscope photographs depicting a component during a failed process, shown as a comparative example.
Figure 22:
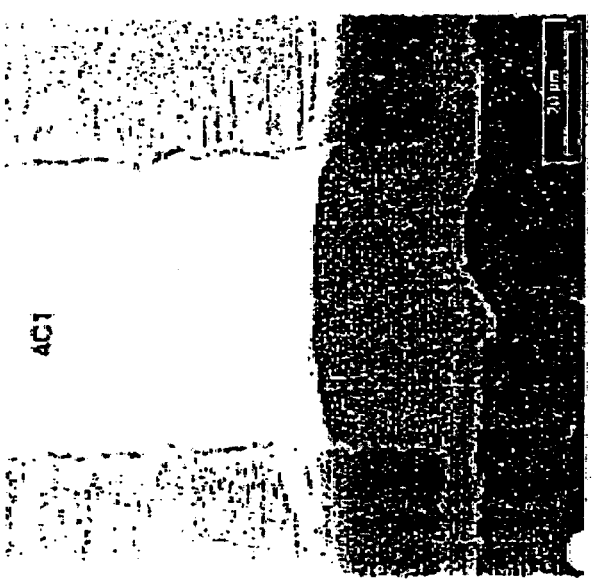
Figure 23:
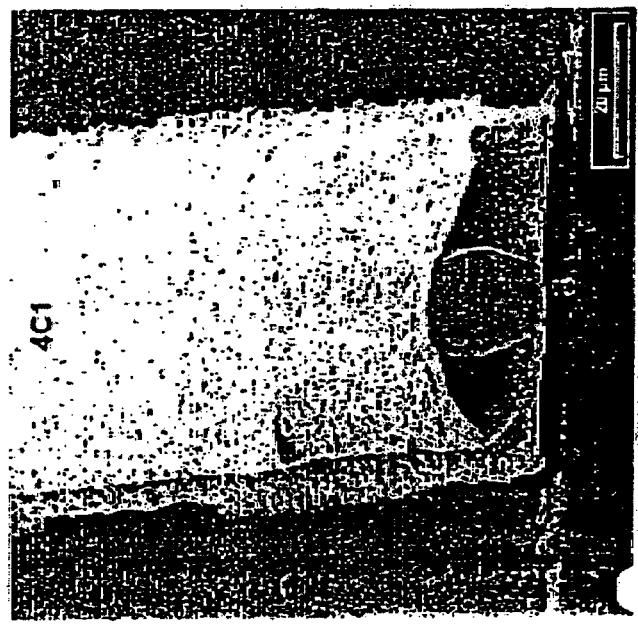

A component is processed as in Example 2 except that the UV exposure is 30 mW/cm$^2$ for 5 minutes. As seen in FIG. 22, the gaps formed by plasma etching are narrower than those formed in Example 2 (FIG. 20) and do not extend all the way down the edges of the principal metal. Thus, when the additional gold cover metal is plated unto the surface of the lead, the additional cover metal does not unite with the bottom cover layer. After removal of the resist, the component is subjected to the same etching conditions as used in Example 2. As seen in FIG. 23, the copper principal metal is severely attacked during the etching procedure used to remove the conductive layer.

What is claimed is:

1. A method of etching an article having a layer of a polymer defining a surface of the article and metallic features at such surface of the article, the method comprising the steps of exposing the article to a plasma reactive with the polymer while applying an electrical potential to said plasma so that said plasma etches the polymer adjacent the metallic features to remove polymer adjacent the metallic features at a greater rate than polymer remote from the metallic features.

2. A method as claimed in claim 1 wherein said step of applying potential to said plasma includes the step of applying a potential to said metallic features of said article.

3. A method as claimed in claim 2 wherein said step of applying a potential to said metallic features includes the step of conductively coupling said metallic features to a source of said potential.

4. A method as claimed in claim 1 wherein said step of applying a potential to said plasma includes the step of applying a potential between a pair of electrodes while said article is disposed adjacent to one of said electrodes.

5. A method as claimed in claim 1 wherein said plasma includes one or more constituents selected from the group consisting of halogens and oxygen.

6. A method as claimed in claim 1 wherein said polymer is selected from the group consisting of acrylics, epoxies and polyimides.

7. A method as claimed in claim 1 wherein said polymer is a photoresist.

8. A method as claimed in claim 1 wherein, prior to said exposing step, said metallic features have edges extending into said layer of polymer from said surface, and wherein said exposing step is terminated at a time when portions of said layer of polymer remote from said edges remain but after gaps have formed between said edges and said portions of said layer of polymer.

* * * * *

UNITED STATES PATENT AND TRADEMARK OFFICE
CERTIFICATE OF CORRECTION

PATENT NO.     : 6,758,984 B2
DATED          : July 6, 2004
INVENTOR(S)    : Belgacem Haba, Irina Poukhova and Masud Beroz It is certified that error appears in the above-identified patent and that said Letters Patent is hereby corrected as shown below:

Column 2,
Line 21, "variability depending due" should read -- variability due --.

Column 5,
Line 5, "to a yet" should read -- to yet --.

Column 7,
Line 12, "from the cover" should read -- from, the cover --.

Signed and Sealed this

Thirtieth Day of November, 2004

JON W. DUDAS
*Director of the United States Patent and Trademark Office*